(12) United States Patent
Hashish et al.

(10) Patent No.: US 12,350,789 B2
(45) Date of Patent: Jul. 8, 2025

(54) FLUID JET NOZZLES AND METHODS OF MAKING SAME

(71) Applicant: Flow International Corporation, Kent, WA (US)

(72) Inventors: Mohamed Hashish, Bellevue, WA (US); Jordan J. Hopkins, Seattle, WA (US)

(73) Assignee: Flow International Corporation, Kent, WA (US)

( * ) Notice: Subject to any disclaimer, the term of this patent is extended or adjusted under 35 U.S.C. 154(b) by 368 days.

(21) Appl. No.: 16/191,327

(22) Filed: Nov. 14, 2018

(65) Prior Publication Data
US 2019/0184523 A1 Jun. 20, 2019

Related U.S. Application Data

(60) Provisional application No. 62/608,459, filed on Dec. 20, 2017.

(51) Int. Cl.
*B24C 5/04* (2006.01)
*B24C 1/04* (2006.01)
(Continued)

(52) U.S. Cl.
CPC ............... *B24C 5/04* (2013.01); *B24C 1/045* (2013.01); *C23C 4/06* (2013.01); *C23C 4/08* (2013.01);
(Continued)

(58) Field of Classification Search
CPC .. C23C 4/06; C23C 4/08; C23C 16/01; C23C 16/27; C23C 4/16; B24C 5/04; B24C 1/045; B23P 15/00; B23P 11/025
See application file for complete search history.

(56) References Cited

U.S. PATENT DOCUMENTS

| | | |
|---|---|---|
| 1,703,029 A | 2/1929 | Fairchild |
| 1,988,432 A | 1/1935 | Gillett et al. |
| | (Continued) | |

FOREIGN PATENT DOCUMENTS

| | | |
|---|---|---|
| CN | 103030020 A | 4/2013 |
| CN | 203738609 U | 7/2014 |
| | (Continued) | |

OTHER PUBLICATIONS

"Steel Definition", yourdictionary.com, 1 page, retrieved Jun. 2023 (Year: 2023).*

(Continued)

*Primary Examiner* — Katherine A Bareford
(74) *Attorney, Agent, or Firm* — Cozen O'Connor

(57) ABSTRACT

Reinforced diamond nozzles and methods of making the same for fluid jet cutting applications are provided. An example method includes forming or providing a tubular diamond body having a jet passage extending therethrough and establishing a protective casing around the tubular diamond body so that an entirety or substantially an entirety of an outer circumferential surface area of the tubular diamond body is directly contacted and reinforced by the protective casing. Establishing the protective casing around the tubular diamond body may include thermal spraying, casting, direct metal laser sintering, or other fabrication techniques.

2 Claims, 7 Drawing Sheets

(51) Int. Cl.
*C23C 4/06* (2016.01)
*C23C 4/08* (2016.01)
*C23C 4/16* (2016.01)
*C23C 16/01* (2006.01)
*C23C 16/27* (2006.01)

(52) U.S. Cl.
CPC ............ *C23C 4/16* (2013.01); *C23C 16/01* (2013.01); *C23C 16/27* (2013.01)

(56) References Cited

U.S. PATENT DOCUMENTS

| | | | |
|---|---|---|---|
| 2,332,407 A | 10/1943 | Davies | |
| 3,228,147 A | 1/1966 | Moore | |
| 3,344,558 A | 10/1967 | Kirkland | |
| 3,419,220 A | 12/1968 | Goodwin et al. | |
| 3,873,959 A * | 3/1975 | Harvey | G10K 11/004 367/173 |
| 4,118,961 A * | 10/1978 | Lee | B60R 25/023 70/237 |
| 4,545,157 A | 10/1985 | Saurwein | |
| 4,593,776 A * | 6/1986 | Salesky | E21B 10/567 175/375 |
| 4,815,241 A | 3/1989 | Woodson | |
| 4,941,298 A | 7/1990 | Fernwood et al. | |
| 5,144,766 A | 9/1992 | Hashish et al. | |
| 5,155,946 A | 10/1992 | Domann | |
| 5,283,990 A | 2/1994 | Shank | |
| 5,311,654 A | 5/1994 | Cook | |
| 5,363,556 A * | 11/1994 | Banholzer | B24C 1/045 29/890.142 |
| 5,407,503 A * | 4/1995 | Matsui | B24C 5/04 156/242 |
| 5,421,766 A | 6/1995 | Shank | |
| 5,439,492 A * | 8/1995 | Anthony | C23C 16/27 51/295 |
| 5,643,058 A | 7/1997 | Erichsen et al. | |
| 5,785,582 A | 7/1998 | Stefanik et al. | |
| 5,869,133 A | 2/1999 | Anthony et al. | |
| 5,961,861 A * | 10/1999 | McCay | B23K 26/34 219/121.65 |
| 6,021,682 A * | 2/2000 | Zeng | B24C 1/045 73/866 |
| 6,212,772 B1 * | 4/2001 | Whitmyre | G10D 13/08 84/411 R |
| 6,425,805 B1 * | 7/2002 | Massa | B24C 5/04 451/40 |
| 6,586,352 B1 * | 7/2003 | Blumberg | B32B 5/28 29/832 |
| 6,766,216 B2 | 7/2004 | Erichsen et al. | |
| 6,851,627 B2 | 2/2005 | Hashish et al. | |
| 7,820,131 B2 | 10/2010 | Hemley et al. | |
| 8,651,920 B2 | 2/2014 | Hashish | |
| 9,066,786 B1 * | 6/2015 | Price | A63B 21/4017 |
| 9,156,133 B2 | 10/2015 | Miller | |
| 9,387,528 B2 | 7/2016 | Sakamoto et al. | |
| 2002/0142709 A1 | 10/2002 | Massa et al. | |
| 2003/0029934 A1 * | 2/2003 | Hashish | B24C 1/045 239/423 |
| 2005/0184637 A1 * | 8/2005 | Sugawara | H01J 29/862 313/477 R |
| 2006/0238074 A1 * | 10/2006 | Manabe | G02B 7/023 310/328 |
| 2008/0153626 A1 * | 6/2008 | Matsunaga | A63B 53/0466 473/350 |
| 2009/0288532 A1 * | 11/2009 | Hashish | B24C 1/045 83/53 |
| 2010/0177793 A1 * | 7/2010 | Rossi | H01S 5/141 372/20 |
| 2011/0121179 A1 * | 5/2011 | Liddiard | H01J 37/244 250/336.1 |
| 2015/0209936 A1 | 7/2015 | Hara et al. | |
| 2017/0008152 A1 | 1/2017 | Miller | |

FOREIGN PATENT DOCUMENTS

| | | |
|---|---|---|
| EP | 0 562 764 A1 | 9/1993 |
| EP | 1411143 A1 | 4/2004 |
| EP | 3096922 A1 | 11/2016 |
| WO | 2008032272 A2 | 3/2008 |
| WO | 2015169263 A2 | 11/2015 |

OTHER PUBLICATIONS

"Just plain carbon steel—What is it?", thefabricator.com, dated Mar. 9, 2010, 6 pages. (Year: 2010).*
"What Are All the Different Types of Steel? Here's a Breakdown", from getmetals.com, 11 pages. (Year: 2019).*
International Search Report and Written Opinion of the International Searching Authority, issued in corresponding International Application No. PCT/US2018/061138, filed Nov. 14, 2018, 21 pages.
Axinte et al., "High Energy Fluid Jet Machining (HEFJet-Mach): From scientific and technological advances to niche industrial applications," CIRP Annals—Manufacturing Technology 63 (2), 2014, 751-771 (21 pages).
Extended European Search Report, dated Aug. 10, 2021, for European Application No. 18891629.0, 9 pages.

* cited by examiner

FLUID JET NOZZLES AND METHODS OF MAKING SAME

CROSS-REFERENCE TO RELATED APPLICATION

This application claims the benefit of Provisional Application No. 62/608,459, filed Dec. 20, 2017, the disclosure of which is incorporated herein by reference.

BACKGROUND

Technical Field

This disclosure is related to fluid jet cutting systems and related components and methods, and, more particularly, to abrasive fluid jet nozzles and methods of making the same.

Description of the Related Art

Fluid jet cutting systems, such as waterjet or abrasive waterjet cutting systems, are used for cutting a wide variety of materials, including stone, glass, ceramics and metals. In a typical waterjet cutting system, high-pressure water flows through a cutting head having a nozzle which directs a cutting jet onto a workpiece after the jet is formed via an orifice unit. The system may draw or feed abrasive media into the high-pressure waterjet to form a high-pressure abrasive waterjet. In addition to such abrasive waterjet cutting systems, other jet cutting systems are known which supply a concentrated mixture of abrasives and water, referred to herein as a "slurry" or a "suspension," directly to an orifice unit of a cutting head prior to formation of a high velocity jet for cutting or processing workpieces. In such systems, an abrasive slurry or suspension is supplied to an orifice unit of a cutting head to form a high velocity jet, which stands in contrast to conventional abrasive waterjet systems wherein abrasives are entrained in a mixing chamber and mixing tube or nozzle downstream of the formation of a high velocity jet via an orifice unit.

With the cutting jet formed, the cutting head may be controllably moved across the workpiece to cut the workpiece as desired, or the workpiece may be controllably moved beneath the waterjet or abrasive waterjet. Systems for generating high-pressure waterjets are currently available, such as, for example, the Mach 4™ five-axis waterjet cutting system manufactured by Flow International Corporation, the assignee of the present application. Other examples of waterjet cutting systems are shown and described in Flow's U.S. Pat. No. 5,643,058.

Abrasive waterjet and abrasive suspension jet cutting systems are advantageously used when cutting workpieces made of particularly hard materials to meet exacting standards, however, the use of abrasives introduces complexities and abrasive waterjet and abrasive suspension jet cutting systems can suffer from other drawbacks, including the need to contain and manage spent abrasives, as well as the deterioration of various components, including the nozzles through which the abrasives and the abrasive waterjets flow, and the resulting need to periodically replace such components.

Abrasive flow nozzles are typically made of hard materials such as tungsten carbide, silicon carbide, or boron carbide because of the abrading properties of the abrasives. Making abrasive flow nozzles out of hard materials improves their resistance to deterioration as a result of exposure to high-speed abrasive particles, and thus increases their lifetime and improves overall cost-effectiveness of abrasive waterjet or abrasive suspension jet cutting techniques. Abrasive fluid jet cutting of certain brittle materials, such as glasses, ceramics, sapphire, silicon carbide, or ceramic matrix composites, however, typically involves using relatively hard abrasive materials, such as aluminum oxide or silicon carbide abrasives, which are harder than more commonly used garnet abrasives, to reduce chipping and fracture of the workpieces being cut. As the hardness of the abrasives increases, however, lifetimes of abrasive flow nozzles of any specific material generally decrease.

Attempts have been made to fabricate abrasive flow nozzles from diamond to increase the hardness of the abrasive flow nozzles and therefore increase their lifetimes and overall cost-effectiveness. One such attempt is described in U.S. Pat. No. 5,785,582, which describes fabricating an abrasive flow nozzle from two distinct halves coupled together, each having a layer of diamond material. Such attempts have succeeded in some respects, but remain relatively expensive, and have other associated drawbacks. Another attempt is described in U.S. Pat. No. 5,869,133, which describes the creation of hollow diamond tubes.

BRIEF SUMMARY

The present disclosure describes reinforced diamond nozzles and methods of making and using reinforced diamond nozzles for fluid jet cutting applications. For example, a reinforced diamond nozzle can include an inner tubular diamond body made of a single structure of diamond material, and an outer reinforcing and protective casing made of one or more layers each comprising a continuous structure of reinforcing material. Such a nozzle can be fabricated by forming the tubular diamond body on a mandrel in a CVD reactor, and then forming the one or more layers of the reinforcing and protective casing directly onto an outer surface of the diamond body.

The methods described herein can facilitate the fabrication of abrasive fluid jet nozzles having tunable, custom, or specified lifetimes under a given set of operating parameters. Such nozzles can be more cost-effective over long periods of time, at least in part because nozzles that have higher than called-for lifetimes are unnecessarily expensive. Further, the abrasive fluid jet nozzles described herein have an inner tubular diamond body, making them harder, and an outer protective casing, making them more resilient and less brittle, which together make the abrasive fluid jet nozzles more resistant to deterioration during fluid jet cutting operations, increase the lifetimes of the nozzles, and improve overall cost-effectiveness of abrasive fluid jet cutting systems and techniques. In some implementations, the abrasive fluid jet nozzles described herein can have lifetimes that match or that are about the same as an fluid jet orifice assembly to be used in combination with the nozzles to generate and discharge the fluid jet, so that both the nozzle and the orifice assembly can be replaced at the same time without sacrificing significant life of either component, thereby reducing or minimizing operational downtime during fluid jet cutting operations.

According to at least one embodiment, a method of making a reinforced diamond nozzle for a fluid jet cutting machine may be summarized as comprising: forming or providing a tubular diamond body having an overall length and including a jet passage extending therethrough, a ratio of the overall length to a maximum dimension of a cross-sectional width of the jet passage being at least twenty; and establishing a protective casing around the tubular diamond body so that an entirety or substantially an entirety of an outer circumferential surface area of the tubular diamond body is directly contacted by and reinforced by the protective casing.

Establishing the protective casing around the tubular diamond body may include thermal spraying a material of the protective casing onto the tubular diamond body, casting a material of the protective casing onto the tubular diamond body, direct metal laser sintering a material of the protective casing onto the tubular diamond body, or other fabrication techniques. For example, in some embodiments, establishing the protective casing around the tubular diamond body may include shrink fitting a material of the protective casing onto the tubular diamond body, wire wrapping a material of the protective casing onto the tubular diamond body, or adhering a material of the protective casing onto the tubular diamond body. In another embodiment, establishing the protective casing may include establishing a hardened composite material around the tubular diamond body using an autoclave.

Forming or providing the tubular diamond body may include fabricating or selecting the tubular diamond body to have a tailored thickness that is based on operating parameters and economics of a cutting operation of the fluid jet cutting machine and a desired lifetime of the reinforced diamond nozzle. Forming or providing the tubular diamond body may further include fabricating the tubular diamond body in a chemical vapor deposition reactor, the fabricating including: determining operating parameters for a chemical vapor deposition operation to obtain the tubular diamond body with the tailored thickness; and performing the chemical vapor deposition operation in the chemical vapor deposition reactor using the operating parameters for the chemical vapor deposition operation.

Fabricating the tubular diamond body in the chemical vapor deposition reactor may include: fabricating the tubular diamond body on a mandrel; and removing the mandrel from the tubular diamond body before or after the protective casing is established around the tubular diamond body. In some instances, the protective casing may be machined to a desired finish prior to removing the mandrel. In such instances, the mandrel may be fixed at each of opposing ends of the mandrel extending beyond the tubular diamond body to assist in the machining of the protective casing.

The tubular diamond body may be fabricated on a tubular mandrel and, after the protective casing is established, the tubular mandrel may be removed from the tubular diamond body by electrical discharge machining, chemical etching or other suitable process. The mandrel may be made of tungsten, molybdenum, tungsten carbide, silicon carbide or some other suitable material.

In some instances, forming or providing the tubular diamond body may include arranging a plurality of tubular diamond body units end-to-end to form an elongate tubular body, and establishing the protective casing around the tubular diamond body may include simultaneously coating the elongate tubular body formed by the plurality of tubular diamond body units.

The method may further include, prior to establishing the protective casing, arranging a supplemental tubular body end-to-end with the tubular diamond body, and thereafter establishing the protective casing around the tubular diamond body and the supplemental tubular body. The supplemental tubular body may be a material different than the tubular diamond body such that the material properties of the reinforced diamond nozzle may vary over a longitudinal length thereof.

In some instances, the method of making the reinforced diamond nozzle may further include establishing an annular structure that extends radially outward from the reinforced diamond nozzle at an intermediate location between opposing ends thereof. Establishing the annular structure may include, for example, forming the annular structure as an integral portion of the protective casing as the protective casing is built up. In other instances, establishing the annular structure may include positioning the annular structure over the tubular diamond body after the protective casing is partially established, and then locking the annular structure in position by completing the protective casing to abut opposing sides of the annular structure.

According to some embodiments, establishing the protective casing may include forming a multilayer protective casing having material properties that vary radially. For example, a material hardness of the multilayer protective casing may vary radially with a material hardness of an innermost layer of the multilayer protective casing being greater than a material hardness of the outermost layer. The multilayer protective casing may include, for example, an inner layer radially adjacent the tubular diamond body and an outer layer radially adjacent the inner layer and the inner layer may be made of molybdenum and the outer layer may be made of steel. In another example embodiment, the inner layer may be made of steel and the outer layer may be made of aluminum or titanium.

The method of making the reinforced diamond nozzle may further include embedding at least one sensor component in the protective casing. For example, a sensor component made of a magnetic material may be embedded, or at least partially embedded, in the casing to provide enhanced functionality. For example, the sensor component may be used to determine when the reinforced diamond nozzle is properly seated in a nozzle body of a cutting head.

In some instances, the ratio of the overall length to the maximum dimension of the cross-sectional width of the jet passage may be at least fifty or at least one hundred. A size and/or a shape of the jet passage may vary along the overall length of the tubular diamond body. For example, a size of the jet passage may increase linearly, in an upstream or in a downstream direction, along at least a portion of the overall length of the tubular diamond body. A cross-sectional profile of the jet passage may be a circle or a regular or irregular polygon, such as a hexagon. A cross-sectional profile of an interface between the tubular diamond body and the protective casing may be circular, hexagonal, rectangular or another regular polygonal shape.

Establishing the protective casing around the tubular diamond body may include establishing the protective casing around the tubular diamond body so that an interface between the tubular diamond body and the protective casing is entirely devoid of any gaps or discontinuities, such as a seam in the nozzle structure. Establishing the protective casing around the tubular diamond body may include establishing the protective casing around the tubular diamond body so that an entirety of the inner circumferential surface area of the protective casing is in direct contact with an entirety of the outer circumferential surface area of the tubular diamond body.

Forming or providing the tubular diamond body and establishing the protective casing around the tubular diamond body may collectively result in a dual layered nozzle structure consisting of an inner layer of diamond and an outer layer of a casing material. Forming or providing of the tubular diamond body and establishing of the protective casing around the tubular diamond body may further include establishing an inner circumferential surface area of the protective casing to be coextensive with the outer circumferential surface area of the tubular diamond body.

Establishing the protective casing around the tubular diamond body may include establishing the protective casing to include a multilayer structure (e.g., bilayer structure, trilayer structure). This may include establishing an intermediate tubular casing around the tubular diamond body and establishing an external tubular casing around the intermediate tubular casing. The intermediate tubular casing may comprise a first material and the external tubular casing may comprise a second material that is different than the first material.

According to at least one embodiment, a reinforced diamond nozzle for a fluid jet cutting machine may be summarized as including: a tubular diamond body having a jet passage extending therethrough; and a protective casing surrounding the tubular diamond body with an entirety or substantially an entirety of an outer circumferential surface area of the tubular diamond body being directly contacted and reinforced by the protective casing. A ratio of an overall length of the tubular diamond body to a maximum dimension of a cross-sectional width of the jet passage may be at least twenty, at least fifty or at least one hundred.

In one particular advantageous embodiment, a cross-section of the jet passage of the tubular diamond body may be circular; an inner diameter of the jet passage may be less than or equal to 0.5 mm; a diamond body thickness of the tubular diamond body may be at least 25 microns; and the protective casing may be cylindrical and have a casing thickness at least as thick as the diamond body thickness of the tubular diamond body. In some instances, the diamond body thickness may be less than or equal to 2,000 microns. The casing thickness may be greater than or equal to 150 microns. A ratio of the casing thickness to the diamond body thickness may be at least 2:1, at least 4:1, or at least 10:1. A ratio of an average casing thickness of the protective casing to an average diamond body thickness of the tubular diamond body may be at least 2:1. A ratio of a maximum casing thickness of the protective casing to a maximum diamond body thickness of the tubular diamond body may be at least 2:1.

A size and/or a shape of the jet passage may vary along a length of the tubular diamond body. A cross-sectional profile of the jet passage may comprise a circle, or a regular or irregular polygon, such as a hexagon. A cross-sectional profile of an interface between the tubular diamond body and the protective casing may be circular, hexagonal, rectangular or another regular polygonal shape. An interface between the tubular diamond body and the protective casing may be entirely devoid of any gaps or discontinuities, such as a seam in the nozzle structure. An entirety of the inner circumferential surface area of the protective casing may be in direct contact with the outer circumferential surface area of the tubular diamond body. The tubular diamond body and the protective casing may collectively form an integrated dual layered nozzle structure consisting of an inner layer of diamond and an outer layer of a casing material, and an inner circumferential surface area of the protective casing may be coextensive with the outer circumferential surface area of the tubular diamond body.

In some instances, the tubular diamond body may include a plurality of tubular diamond body units arranged end-to-end, and the protective casing may surround each of the plurality of tubular diamond body units.

The reinforced diamond nozzle may further include a supplemental tubular body positioned end-to-end with the tubular diamond body, and the protective casing may surround the tubular diamond body and the supplemental tubular body.

The reinforced diamond nozzle may further include an annular structure that extends radially outward from the reinforced diamond nozzle at an intermediate location between opposing ends thereof. The annular structure may be an integral portion of the protective casing, or may be partially embedded in the protective casing.

The protective casing may be multilayered with material properties that vary radially. For example, a material hardness of the multilayer protective casing may vary radially with a material hardness of an innermost layer of the multilayer protective casing being greater than a material hardness of the outermost layer. The multilayer protective casing may be a bilayer structure having an inner layer radially adjacent the tubular diamond body and an outer layer radially adjacent the inner layer. The inner layer may comprise a first material and the outer layer may comprise a second material that is different than the first material. The inner layer may be made of molybdenum and the outer layer may be made of steel, for example, or the inner layer may be made of steel and the outer layer may be made of aluminum or titanium.

DETAILED DESCRIPTION

Figure 1:
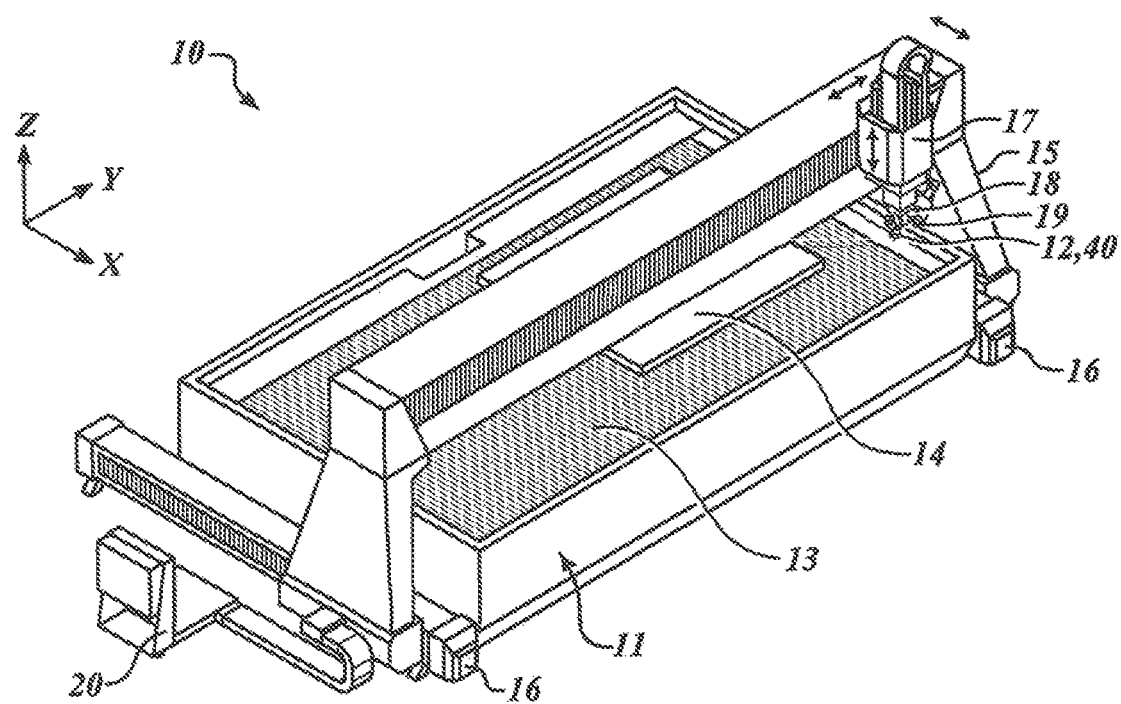
FIG. 1 is a view of an example fluid jet cutting system, according to one embodiment, which comprises a multi-axis manipulator (e.g., gantry motion system) supporting a cutting head assembly at a working end thereof.

In the following description, certain specific details are set forth in order to provide a thorough understanding of various disclosed embodiments. However, one of ordinary skill in the relevant art will recognize that embodiments may be practiced without one or more of these specific details. In other instances, well-known structures associated with fluid jet cutting systems and methods of operating the same may not be shown or described in detail to avoid unnecessarily obscuring descriptions of the embodiments. For instance, well known control systems and drive components may be integrated into the fluid jet cutting systems to facilitate movement of the fluid jet cutting head assembly relative to the workpiece or work surface to be processed, or vice versa. These systems may include drive components to manipulate the cutting head about multiple rotational and/or translational axes, as is common in multi-axis manipulators of fluid jet cutting systems. Example fluid jet cutting systems may include a fluid jet cutting head assembly coupled to a gantry-type motion system, as shown in FIG. 1, a robotic arm motion system, or other motion system for moving the cutting head relative to a workpiece. In other instances, a robotic arm motion system or other motion system may manipulate the workpiece relative to a stationary cutting head.

Unless the context requires otherwise, throughout the specification and claims which follow, the word "comprise" and variations thereof, such as "comprises" and "comprising," are to be construed in an open, inclusive sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the context clearly dictates otherwise. It should also be noted that the term "or" is generally employed in its sense including "and/or" unless the context clearly dictates otherwise.

Although some aspects discussed herein may be discussed in terms of waterjets, abrasive waterjets and/or abrasive suspension jets, one skilled in the relevant art will recognize that aspects and techniques of the present invention may be applied to any type of fluid jet, generated by high pressure or low pressure, whether or not additives or abrasives are used.

As used herein, the term cutting head or cutting head assembly may refer generally to an assembly of components at a working end of the fluid jet machine or system, and may include, for example, an orifice unit, such as a jewel orifice, through which fluid (e.g., water) passes during operation to generate a pressurized fluid jet, a nozzle component for discharging the pressurized fluid jet, and surrounding structures and devices coupled directly or indirectly thereto to move in unison therewith. The cutting head may also be referred to as an end effector.

FIG. 1 shows an example embodiment of a fluid jet cutting system 10. The fluid jet cutting system 10 includes a catcher tank assembly 11 having a work support surface 13 (e.g., an arrangement of slats) that is configured to support a workpiece 14 to be processed by the system 10. The fluid jet cutting system 10 further includes a bridge assembly 15 which is movable along a pair of base rails 16 and straddles the catcher tank assembly 11. In operation, the bridge assembly 15 can move back and forth along the base rails 16 with respect to a translational axis X to position a cutting head assembly 12 of the system 10 for processing the workpiece 14. A tool carriage 17 may be movably coupled to the bridge assembly 15 to translate back and forth along another translational axis Y, which is aligned perpendicularly to the aforementioned translational axis X. The tool carriage 17 may be configured to raise and lower the cutting head assembly 12 along yet another translational axis Z to move the cutting head assembly 12 toward and away from the workpiece 14. One or more manipulable links or members may also be provided intermediate the cutting head assembly 12 and the tool carriage 17 to provide additional functionality.

As an example, the fluid jet cutting system 10 may include a forearm 18 rotatably coupled to the tool carriage 17 for rotating the cutting head assembly 12 about an axis of rotation, and a wrist 19 rotatably coupled to the forearm 18 to rotate the cutting head assembly 12 about another axis of rotation that is non-parallel to the aforementioned rotational axis. In combination, the rotational axes of the forearm 18 and wrist 19 can enable the cutting head assembly 12 to be manipulated in a wide range of orientations relative to the workpiece 14 to facilitate, for example, cutting of complex profiles. The rotational axes may converge at a focal point which, in some embodiments, may be offset from the end or tip of a nozzle 40 of the cutting head assembly 12, which may be formed in accordance with embodiments of the methods described herein.

During operation, movement of the cutting head assembly 12 with respect to each of the translational axes and one or more rotational axes may be accomplished by various conventional drive components and an appropriate control system 20. The control system may generally include, without limitation, one or more computing devices, such as processors, microprocessors, digital signal processors (DSP), application-specific integrated circuits (ASIC), and the like. To store information, the control system may also include one or more storage devices, such as volatile memory, non-volatile memory, read-only memory (ROM), random access memory (RAM), and the like. The storage devices can be coupled to the computing devices by one or more buses. The control system may further include one or more input devices (e.g., displays, keyboards, touchpads, controller modules, or any other peripheral devices for user input) and output devices (e.g., display screens, light indicators, and the like). The control system can store one or more programs for processing any number of different workpieces according to various cutting head movement instructions. The control system may also control operation of other components, such as, for example, a secondary fluid source, a vacuum device and/or a pressurized gas source coupled to the fluid jet cutting head assemblies and components described herein. The control system, according to one embodiment, may be provided in the form of a general purpose computer system. The computer system may include components such as a CPU, various I/O components, storage, and memory. The I/O components may include a display, a network connection, a computer-readable media drive, and other I/O devices (a keyboard, a mouse, speakers, etc.). A control system manager program may be executing in memory, such as under control of the CPU, and may include functionality related to, among other things, routing pressurized water through the fluid jet cutting systems described herein, providing a flow of secondary fluid to adjust or modify the coherence of a discharged fluid jet and/or providing a pressurized gas stream to provide for unobstructed fluid jet cutting of a workpiece.

Further example control methods and systems for fluid jet cutting systems, which include, for example, CNC functionality, and which are applicable to the fluid jet cutting systems described herein, are described in U.S. Pat. No. 6,766,216. In general, computer-aided manufacturing (CAM) processes may be used to efficiently drive or control a fluid jet cutting head along a designated path, such as by enabling two-dimensional or three-dimensional models of workpieces generated using computer-aided design (i.e., CAD models) to be used to generate code to drive the machines. For example, in some instances, a CAD model may be used to generate instructions to drive the appropriate controls and motors of a fluid jet cutting system to manipulate the cutting head about various translational and/or rotational axes to cut or process a workpiece as reflected in the CAD model. Details of the control system, conventional drive components and other well-known systems associated with fluid jet cutting systems, however, are not shown or described in detail to avoid unnecessarily obscuring descriptions of the embodiments. Other known systems associated with fluid jet cutting systems include, for example, a pressurized fluid source (e.g., direct drive and intensifier pumps with pressure ratings ranging from about 60,000 psi or lower to about 110,000 psi or higher) for supplying pressurized fluid to the cutting head.

According to some embodiments, the fluid jet cutting system 10 includes a pump, such as, for example, a direct drive pump or intensifier pump, to selectively provide a source of pressurized fluid (e.g., water) at an operating pressure of between about 60,000 psi or lower and about 110,000 psi or higher. The cutting head assembly 12 of the fluid jet cutting system 10 is configured to receive the pressurized fluid supplied by the pump and to generate a pressurized fluid jet for processing workpieces. A fluid distribution system in fluid communication with the pump and the cutting head assembly 12 is provided to assist in routing pressurized fluid from the pump to the cutting head assembly 12.

Example fluid jet cutting systems may include a fluid jet cutting head assembly coupled to a gantry-type motion system, as shown in FIG. 1, a robotic arm motion system or other motion system for moving the cutting head relative to a workpiece. In other instances, a robotic arm motion system or other motion system may manipulate the workpiece relative to a cutting head.

Figure 2:
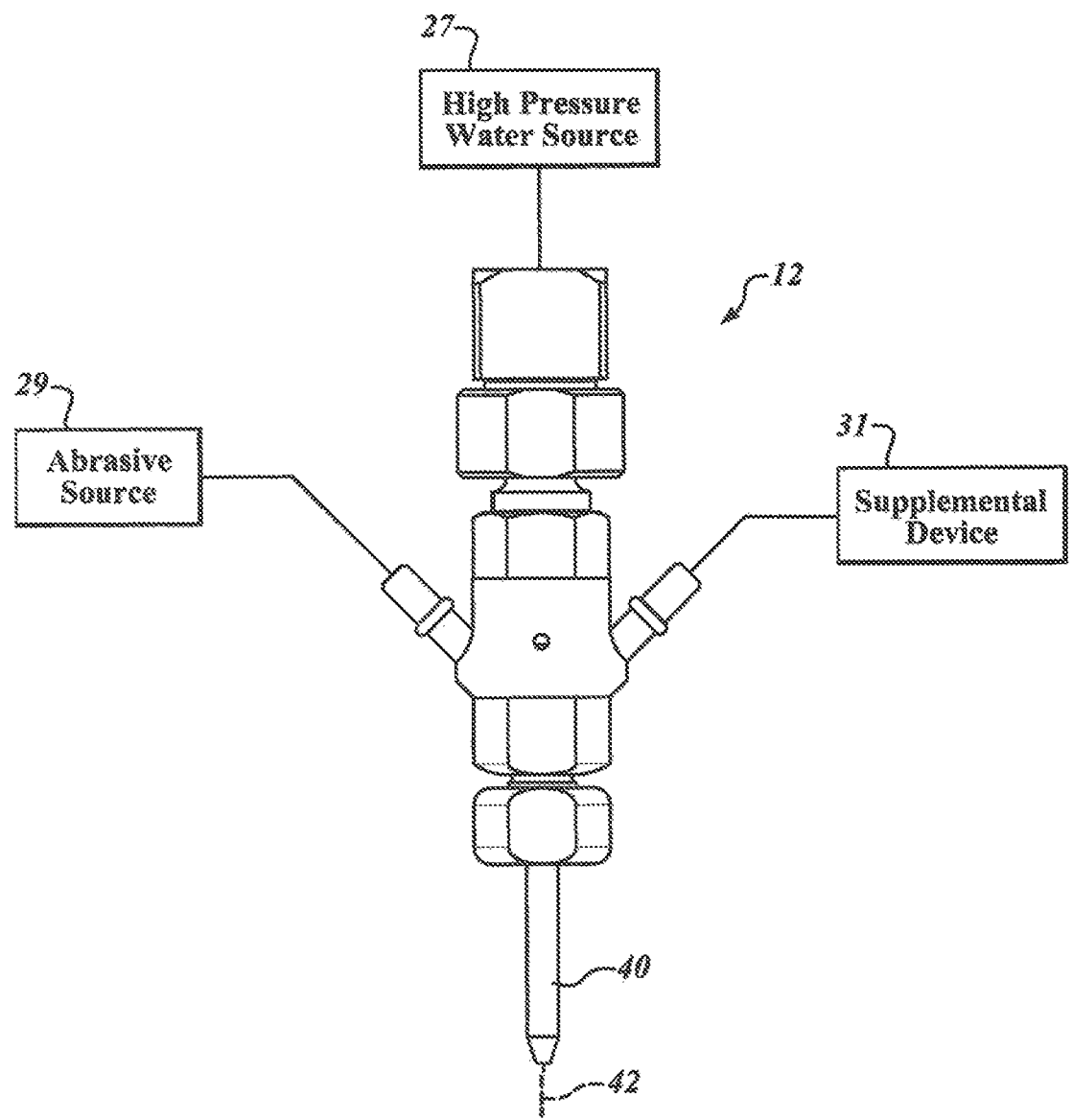
FIG. 2 is a view of an example cutting head assembly coupled to a source of abrasive material, a source of high pressure water, and a supplemental device, which may be part of the fluid jet cutting system of FIG. 1.

FIG. 2 illustrates that other well-known systems associated with fluid jet cutting machines may be provided, such as, for example, a pressurized fluid source, such as a high-pressure or ultrahigh-pressure water source 27, which may be a direct drive or intensifier pump with a pressure rating ranging from about 60,000 psi or lower to about 110,000 psi or higher, for supplying high-pressure or ultra-high-pressure water to the cutting head 12, and/or an abrasive source 29, such as an abrasive hopper and distribution system, for feeding abrasives to the cutting head 12 to enable abrasive waterjet cutting.

In some embodiments, a supplemental device 31 may also be provided to assist a cutting operation in one or more ways. In some cases, the supplemental device 31 can be a vacuum device that can assist in drawing abrasives into the fluid from the fluid source to produce a consistent abrasive fluid jet to enable particularly accurate and efficient workpiece processing. In other cases, the supplemental device 31 can be a secondary abrasive feed source, a pressurized air source, or other device that assists or augments the operation of the cutting head 12. In some instances, the supplemental device 31 may not be provided.

Figure 3:
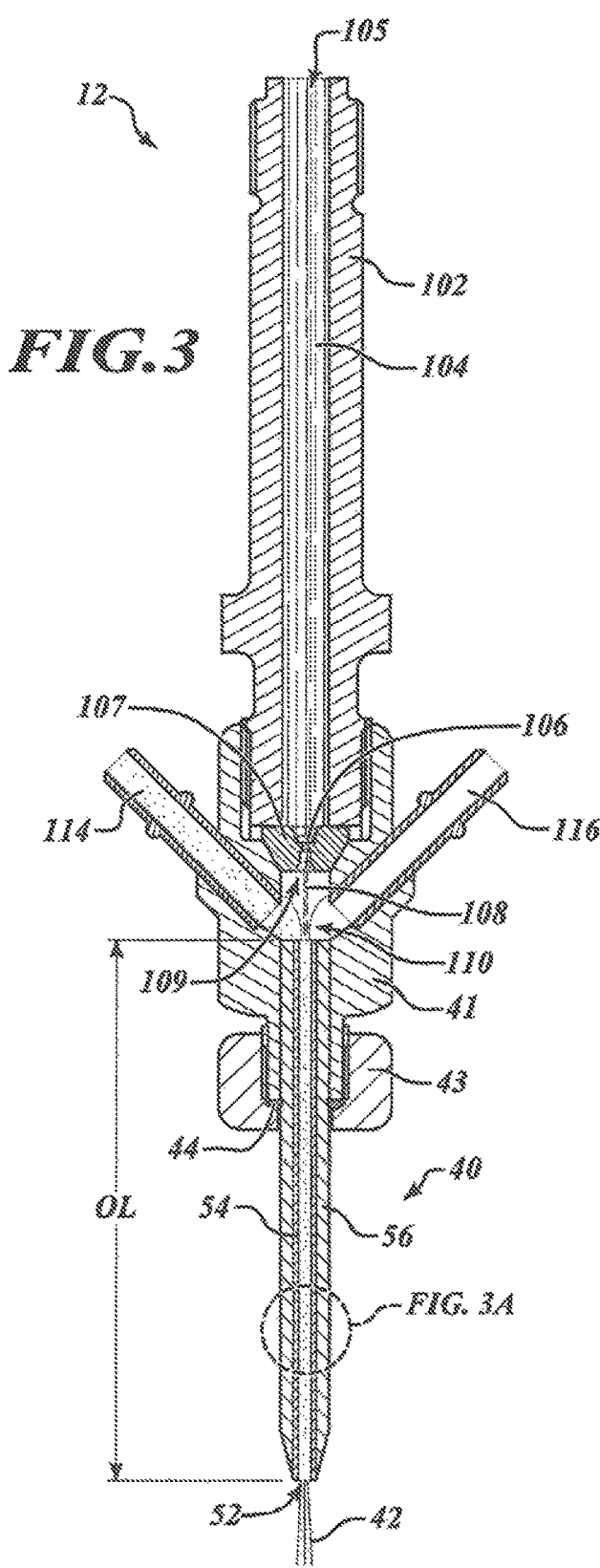
FIG. 3 is a cross-sectional view of a portion of the example cutting head assembly of FIG. 2 showing flow paths of fluid and abrasive materials within the cutting head assembly.

The cutting head 12 includes a mixing tube or nozzle 40 (hereinafter "nozzle"), from which a jet 42 exits at the cutting head at high velocity. The nozzle 40 may be formed according to the methods disclosed herein to include a tubular diamond body 54 and a protective casing 56 thereabout, as shown in FIG. 3 and as described in more detail herein. In some cases, the jet 42 may be an abrasive fluid jet including a fluid, such as water, mixed with abrasives. In other cases, the jet 42 can be an abrasive slurry jet, a pure water jet or other high pressure fluid jet configured to cut or process workpieces or work surfaces in a desired manner.

FIG. 3 provides a cross-sectional view of the example cutting head 12, which includes a high-pressure water body 102 having a flow passage 105 through which pressurized water 104 can be supplied to an orifice unit 106 (e.g., a jewel orifice) of the cutting head 12. The orifice unit 106 may be received in an orifice assembly or orifice mount 107, which can be removed and replaced as needed or desired. The pressurized water 104 can pass through the orifice unit 106 to create a fluid jet 108 that follows a fluid jet path through a mixing chamber 110, through the fluid jet nozzle 40, and out of the cutting head 12 toward a workpiece or work surface to be processed by the discharged fluid jet 42. FIG. 3 also shows that the cutting head 12 may include an abrasive inlet 114, through which abrasive particles can be supplied to the mixing chamber 110 from an abrasive source (e.g., abrasive source 29 of FIG. 2), and a supplemental port or passage 116, which may serve as an abrasive outlet, through which unused abrasive particles can be withdrawn from the mixing chamber 110, or which may serve as an additional abrasive feed inlet, a jet alteration passage, or other functional passage for assisting in forming or altering the nature of the discharged jet 42. In some instances, a vacuum can be applied to the supplemental port or passage 116 to assist in drawing abrasives into the mixing chamber 110 during at least a portion of a cutting operation, such as may be provided during system start-up to provide vacuum assisted entrainment of the abrasives. The abrasives become mixed and entrained into the fluid jet 108 within the mixing chamber 110 and within the nozzle 40 such that the discharged fluid jet 42 comprises an abrasive fluid jet.

Figure 3A:
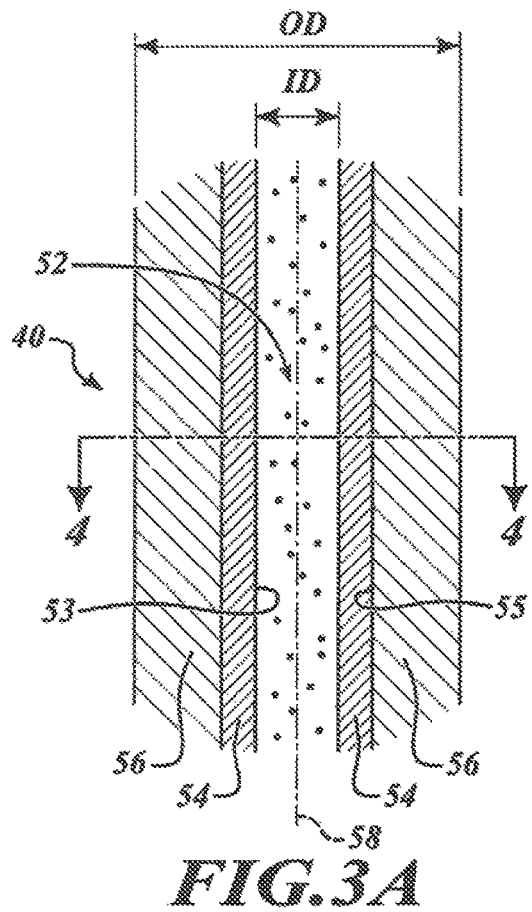
FIG. 3A is an enlarged detail view of a portion of a nozzle of the cutting head assembly illustrated in FIG. 3.

With reference to FIGS. 3 and 3A, the nozzle 40 may be coupled to or otherwise secured to the cutting head 12 in a removable manner, such as, for example, by securing the nozzle 40 within a corresponding nozzle receiving cavity of a nozzle body 41 with a nozzle nut 43, which may engage, for example, a collar 44 or other annular structure that extends radially outward from the nozzle 40 to secure the nozzle 40 to the nozzle body 41. In this manner, the nozzle 40 may be removed and replaced as needed or desired, such as when the nozzle 40 becomes excessively worn.

With continued reference to FIGS. 3 and 3A, and as described in greater detail below, the nozzle 40 can include an inner tubular diamond body 54 having a jet passage 52 extending therethrough, and an outer protective casing 56, which surrounds an outer surface of the tubular diamond body 54 and reinforces the tubular diamond body 54. As also described in greater detail below, the nozzle 40 can be fabricated by forming the tubular diamond body 54 in a CVD reactor and then forming the protective casing 56 directly onto the tubular diamond body 54 to substantially or completely encase and reinforce the tubular diamond body 54.

Figure 4:
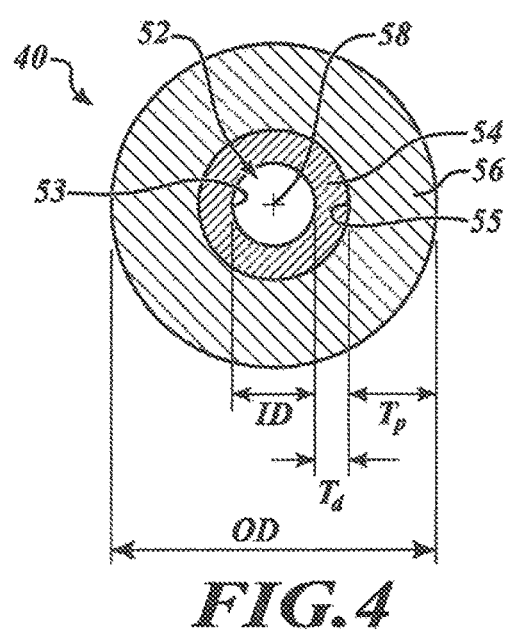
FIG. 4 is a cross-sectional view of the example abrasive fluid jet nozzle of FIG. 3 taken along line 4-4 of FIG. 3A.

With reference to FIGS. 3, 3A and 4, the protective casing 56 may surround the tubular diamond body 54 such that an entirety or substantially an entirety of an outer circumferential surface area of the tubular diamond body 54 is directly contacted and reinforced by the protective casing 56. For instance, in some embodiments, the outer circumferential surface area of the tubular diamond body 54 may be coextensive with the inner circumferential surface area of the protective casing 56 at an interface 55. The outer circumferential surface area of the tubular diamond body 54 and the inner circumferential surface area of the protective casing 56 may be cylindrical, a regular or irregular prism, or other shape. The interface 55 may be seamless. The interface 55 may include no or substantially no gaps or voids between the protective casing 56 and the tubular diamond body 54, so that the interface 55 is entirely or substantially devoid of any gaps or discontinuities (e.g., seams in the nozzle structure). In other instances, the tubular diamond body 54 may be provided in longitudinally arranged segments or body units within the protective casing 56 such that there may be one or more discontinuities at the interface between abutting segments or body units of the tubular diamond body 54.

The nozzle 40 may have an overall length OL and a ratio of the overall length OL of the tubular diamond body 54 to a maximum dimension of a cross-sectional width of the jet passage 52 may be at least twenty to provide relatively slender nozzles 40 with a high aspect ratio. In some instances, the ratio of the overall length OL of the tubular diamond body 54 to the maximum dimension of a cross-sectional width of the jet passage 52 may be at least fifty, at least one hundred, at least one hundred and fifty, or at least two hundred. In the case in which the jet passage 52 of the tubular diamond body 54 is a cylinder having a circular cross-section, the maximum dimension of the cross-sectional width of the jet passage 52 will be defined by an inner diameter ID of the tubular diamond body 54. In the case in which the jet passage 52 of the tubular diamond body 54 is an elliptical cylinder with an oval cross-section, the maximum dimension of the cross-sectional width of the jet passage 52 will be defined by the major axis of the oval. As another example, in the case in which the jet passage 52 of the tubular diamond body 54 is a rectangular prism, the maximum dimension of the cross-sectional width of the jet passage 52 will be defined by the diagonal of the rectangular cross-section.

In some embodiments, the diamond body thickness $T_d$ of the tubular diamond body 54 may be less than or equal to 2000 microns, 1000 microns, 500 microns, 250 microns, 150 microns, 100 microns or 50 microns. In some embodiments, the diamond body thickness $T_d$ of the tubular diamond body 54 may be less than or equal to a protective casing thickness $T_p$ of the protective casing 56, which may, in some instances, be 150 microns or greater. A ratio of the protective casing thickness $T_p$ to the diamond body thickness $T_d$ may be at least 2:1, at least 4:1, or at least 10:1. A ratio of an average casing thickness of the protective casing 56 to an average diamond body thickness of the tubular diamond body 54 may be at least 2:1, at least 4:1, or at least 10:1. A ratio of a maximum casing thickness of the protective casing 56 to a maximum diamond body thickness of the tubular diamond body 54 may be at least 2:1, at least 4:1, or at least 10:1. In the case in which the tubular diamond body 54 is a hollow right circular cylinder, as shown in the example embodiment of the nozzle 40 of FIGS. 3 through 4, the average diamond body thickness and maximum diamond body thickness may be the same given that the diamond body thickness $T_d$ is constant over the length OL of the nozzle 40. Similarly, in the case in which the protective casing 56 is a hollow right circular cylinder, as shown in the example embodiment of the nozzle 40 of FIGS. 3 through 4, the average protective casing thickness and maximum protective casing thickness may be the same given that the protective casing thickness $T_p$ is constant over the length OL of the nozzle 40.

In some embodiments, including the example embodiment shown in FIGS. 3 through 4, a size and/or a shape of the jet passage 52 may be constant (or substantially constant) along an entire length of the tubular diamond body 54. In other embodiments, a size and/or a shape of the jet passage 52 may vary along at least a portion of the entire length of the tubular diamond body 54. For example, as shown in the example embodiment of the nozzle 140 of FIG. 7, a cross-sectional diameter of an upstream end of the jet passage 152 may gradually increase toward the upstream end of the nozzle 140 to provide a flared entrance to receive the high-pressure fluid jet during operation. In such instances, a thickness of the tubular diamond body 154 may remain constant or generally constant and a thickness of the protective casing 156 may gradually decrease in correlation with the increasing cross-sectional size of the of the jet passage 152 such that the outer profile of the nozzle 140 remains constant or generally constant over a longitudinal length of the nozzle 140.

In other implementations, the jet passage 52, as shown in FIG. 4, may lack such a flared portion that increases in size (e.g., diameter) as it approaches the end of the nozzle 40. In such implementations, the upstream end of the nozzle 40 may be located in relatively close proximity to a jet discharge passage 109 formed in the orifice mount 107 which includes the orifice unit 106 for generating the jet, as shown in FIG. 3. In addition, the jet discharge passage 109 and jet passage 52 may be coaxially aligned with high precision to avoid or substantially prevent the jet 108 from impacting end surfaces of the upstream end of the nozzle 40 during operation.

With reference to FIGS. 3 through 4, a cross-sectional profile of the jet passage 52 defined by the tubular diamond body 54 may comprise a circle (as shown), a square, a hexagon, a rectangle, or any regular or irregular polygon. A cross-sectional profile of the interface 55 between the tubular diamond body 54 and the protective casing 56 may be circular (as shown), square, hexagonal, rectangular or another regular polygonal shape. A cross-sectional profile of an outer surface of the protective casing 56 may be circular (as shown), square, hexagonal, rectangular or another regular polygonal shape.

According to the example embodiment of the nozzle 40 shown in FIGS. 3 through 4, the cross-sectional profile of the jet passage 52, the interface 55 between the tubular diamond body 54 and the protective casing 56, and the outer surface of the protective casing 56 are each circular to provide a nozzle 40 consisting of two distinct layers each having the form of a hollow right circular cylinder. In this case, the nozzle 40 may have a constant inner diameter ID and a constant outer diameter OD along its entire length OL along a central longitudinal axis 58. Thus, a cross-section of the nozzle 40 taken perpendicular to the central longitudinal axis 58 (such as shown in FIG. 4) may be the same regardless of its location along the axis 58. That is, the number, location, and identities of the layers of the nozzle 40 may be the same along the entire length OL of the nozzle 40. Although the nozzle 40 is shown as including a bilayer structure (i.e., an inner layer defined by the tubular diamond body 54 and an outer layer defined by the protective casing 56), it is appreciated that the nozzle 40 may comprise a trilayer or other multilayer structure and include a protective casing 56 that includes two or more distinct casing layers, as shown, for example, in the example embodiments of FIGS. 8 through 11.

Figure 5:
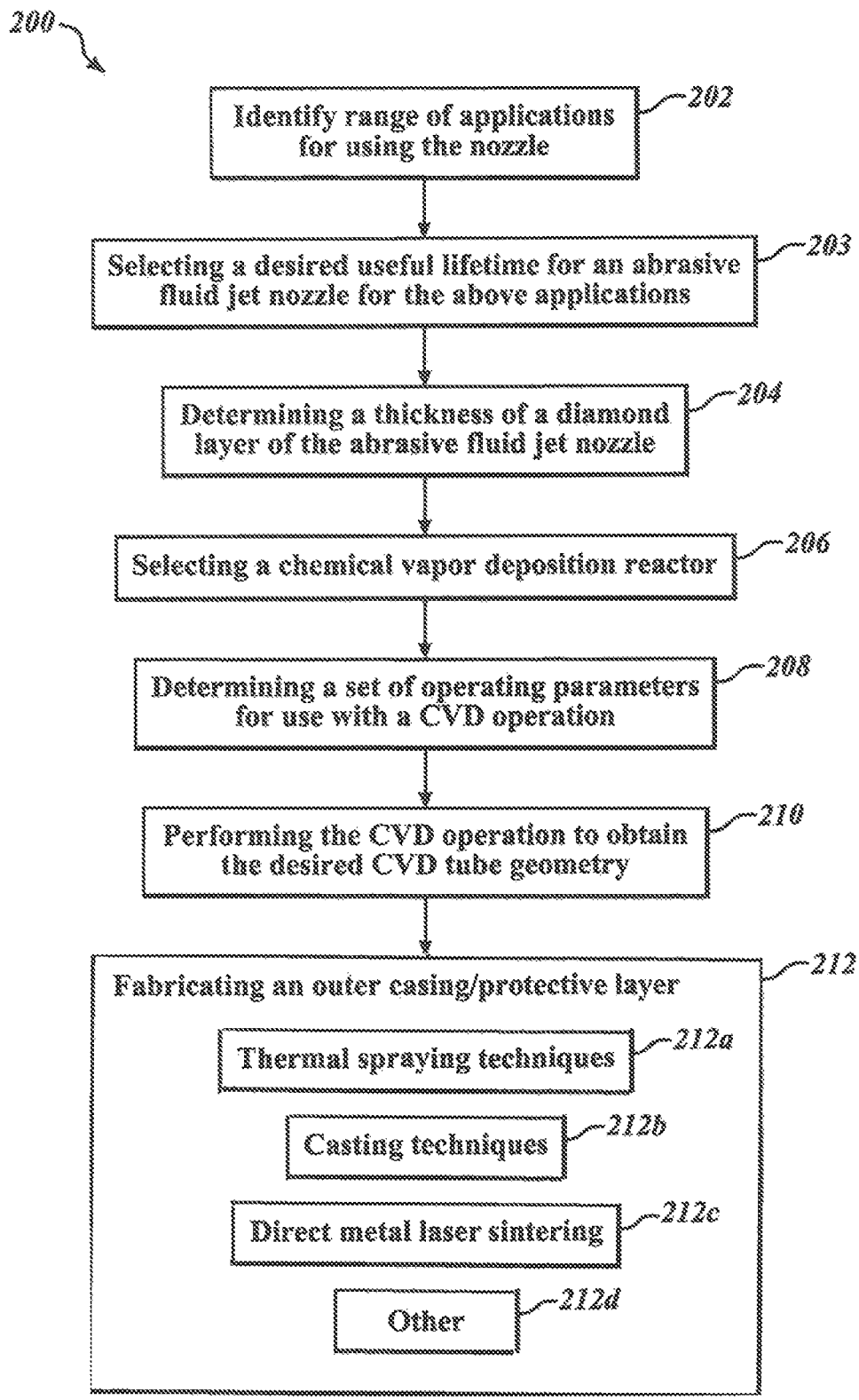
FIG. 5 is a flow chart diagram of an example method of fabricating an abrasive fluid jet nozzle, such as the nozzle of the example embodiment shown in FIG. 3.

With reference now to FIG. 5, a method 200 of fabricating an abrasive fluid jet nozzle is provided, according to one example embodiment, that may be used to fabricate the example nozzle 40 shown in FIGS. 3, 3A and 4. As shown in FIG. 5, the method 200 can include identifying a range of applications for using a nozzle 40, at 202. Such applications may be associated with various system and operating parameters, which may include, for example, one or more of the following: a type of fluid jet cutting system to perform the fluid jet cutting operation (e.g., an abrasive waterjet, pure waterjet, or slurry jet cutting system); an abrasive material type (e.g., garnet, aluminum oxide, or silicon carbide); a flow rate of the abrasive material to be supplied to an abrasive inlet (e.g., 0.61 lb/min at 87 ksi, 0.51 lb/min at 60 ksi); a type of supplemental device that may be coupled to the cutting system (e.g., a secondary abrasive feed source, a pressurized air source, or a vacuum device); a magnitude of a vacuum to be applied to an abrasive outlet, if provided; a magnitude of the operating pressure of the water to be supplied to the fluid jet cutting system (e.g., 55 to 65 ksi, 65 to 75 ksi, 75 to 85 ksi, 85 to 95 ksi, or greater than 95 ksi); an orifice size of the orifice unit 106 (e.g., 0.18 mm, 0.25 mm, 0.30 mm); a fluid jet size defined by the jet passage 52 of the nozzle 40 (e.g., 0.15 mm, 0.2 mm, or 0.25 mm, 0.5 mm, 0.75 mm, or 1.00 mm); a workpiece material type (e.g., metal, ceramic, glass, plastic, or composite); a workpiece material thickness (e.g., 0 to 5 mm, 5 to 15 mm, 15 to 25 mm, or 25 to 35 mm), etc.

The method 200 can also include identifying and/or selecting a desired useful lifetime for an abrasive fluid jet nozzle to be used for the identified range of applications, at 203. For example, the desired useful lifetime for the abrasive fluid jet nozzle can be a specific number of operational hours, which can be identified or selected to match an operational lifetime of an orifice assembly or mount (e.g., orifice mount 107 of FIG. 3) of the cutting system to be operated in accordance with the identified range of applications, or to provide a sufficient number of operational hours to complete a set of all intended cuts in a single workpiece, or to complete a specific number of cuts, or to cut a specific total cutting distance. In some cases, such a number of operational hours can be multiplied by a factor of safety or other scale factor (e.g., 1.05) to arrive at the desired useful lifetime.

With reference to FIGS. 3 through 5, the method 200 may further include determining a thickness $T_d$ of a tubular diamond body 54 of the abrasive fluid jet nozzle 40 that is required to provide the abrasive fluid jet nozzle 40 with at least the desired useful lifetime in light of or based at least in part upon the system and operating parameters associated with the range of applications for which the nozzle 40 will be used, at 204. Such a determination can be based at least in part on an understanding that a useful lifetime of the nozzle 40 can be proportional to a thickness $T_d$ of the tubular diamond body 54.

The method 200 can also include identifying and/or selecting a chemical vapor deposition (CVD) reactor, within which a tubular diamond body of an abrasive fluid jet nozzle will be fabricated, at 206. As examples, the CVD reactors and techniques described in U.S. Pat. No. 5,869,133, or any other commercially available CVD reactors or techniques, can be used. The method 200 can also include determining a set of CVD operating parameters for use with a CVD operation within the CVD reactor, such as temperature(s), pressure(s), and residence time(s) to be used with the CVD operation, based on the selected CVD reactor, to fabricate the tubular diamond body 54 to have the determined thickness $T_d$, at 208.

The method 200 can also include performing the CVD operation within the CVD reactor using the CVD operating parameters to fabricate the tubular diamond body 54 of the abrasive fluid jet nozzle 40 having the determined thickness $T_d$, at 210. In doing so, an operator can make use of any of the features described in U.S. Pat. No. 5,869,133, which is hereby incorporated herein by reference, in its entirety. For example, the tubular diamond body 54 can be fabricated on a hollow mandrel, and the hollow mandrel can then be removed from the tubular diamond body 54 (either before or after fabricating the protective casing 56 as described below).

The method 200 can also include fabricating the outer protective casing 56 to surround the tubular diamond body 54, so that an inner surface of the protective casing 56 is in direct physical contact with an outer surface of the tubular diamond body 54 at interface 55, so that substantially no gaps or voids exist between the protective casing 56 and the tubular diamond body 54, so that an interface between the tubular diamond body 54 and the protective casing 56 is entirely devoid of any gaps or discontinuities (e.g., seams in the nozzle structure), so that an entirety of the inner circumferential surface area of the protective casing 56 is in direct contact with the outer circumferential surface area of the tubular diamond body 54, so that an entirety of the outer circumferential surface area of the tubular diamond body 54 is in direct contact with the inner circumferential surface area of the protective casing 56, so that the inner circumferential surface area of the protective casing 56 is coextensive with the outer circumferential surface area of the tubular diamond body 54, and/or so that an entirety of an outer circumferential surface area of the tubular diamond body is directly contacted by and reinforced by the protective casing 56, at 212.

In some instances, the protective casing 56 may be fabricated to surround the tubular diamond body 54 while the tubular diamond body 54 is supported from an interior thereof, such as by a mandrel used in the fabrication of the tubular diamond body 54. In other instances, the protective casing 56 may be fabricated to surround the tubular diamond body 54 while the interior of the tubular diamond body 54 is unsupported.

In forming the protective casing 56 to surround the tubular diamond body 54, an operator can make use of any one of a variety of suitable techniques. For example, an operator can apply the outer protective casing 56 to the inner tubular diamond body 54 using flame spraying or thermal spraying techniques, in which a melted material, such as a melted metallic material, is sprayed onto the outer surface of the tubular diamond body 54, at 212a. As another example, an operator can apply the outer protective casing 56 to the inner tubular diamond body 54 using casting techniques, in which the outer protective casing 56 is poured in a molten form and cast around the tubular diamond body 54, at 212b.

As another example, an operator can apply the outer protective casing 56 to the inner tubular diamond body 54 using additive manufacturing techniques such as three-dimensional printing or direct metal laser sintering, in which a laser is fired at a powdered material, such as a powdered metallic material, in a pre-determined pattern surrounding the tubular diamond body 54, to weld the powdered material into a solid and continuous structure surrounding the tubular diamond body 54, at 212c.

In accordance with some embodiments, an operator may apply the outer protective casing 56 to the inner tubular diamond body 54 using a variety of other techniques, at 212d, such as using adhesives (e.g., glues or epoxies), press-fitting techniques, shrink-fitting techniques, or electroplating techniques. In some embodiments, an operator may form the outer protective casing 56 by wrapping carbon fiber composite material or other composite material into a tube around the tubular diamond body 54 and hardening the composite material in an autoclave. In other embodiments, an operator may form the outer protective casing 56 by winding a wire into a tube around the tubular diamond body 54. In yet other embodiments, an operator may form the outer protective casing 56 in two distinct semi-cylindrical portions, which can then be positioned around the tubular diamond body 54 and coupled to one another to surround the tubular diamond body 54, using techniques similar to those described in U.S. Pat. No. 5,785,582, which is hereby incorporated herein by reference, in its entirety.

The outer protective casing 56 of the abrasive fluid jet nozzles 40 described herein can be made from any suitable material, such as any suitable metal (e.g., steel, aluminum, or titanium), plastic, or composite material or combinations thereof.

In some cases, the operations 202-212 described above can be performed in the order in which they have been described, while in other cases, the order of these operations can be altered as needed based on the specific circumstances of the application. In implementations in which the tubular diamond body 54 is fabricated on a hollow mandrel, the mandrel can be removed from the tubular diamond body 54 either before or after the outer protective casing 56 is formed on the outer surface of the tubular diamond body 54 at 212. For example, in some cases, the mandrel can be removed after the outer protective casing 56 has been formed at 212, so that the mandrel provides support for the tubular diamond body 54 while the protective casing 56 is being formed.

The result of the example method 200 may, in some instances, be an abrasive fluid jet nozzle 40 having an inner tubular diamond body 54 and an outer protective casing 56, where the outer protective casing 56 is coupled to the inner tubular diamond body 54 so that substantially no gaps or voids exist between the protective casing 56 and the tubular diamond body 54. For example, in one particularly advantageous embodiment, the outer protective casing 56 is formed intimately with the inner tubular diamond body 54 such that outer surface(s) of the tubular diamond body 54 is/are coextensive with interior surface(s) of the protective casing 56 at interface 55. The coextensive joining of the two structures 54, 56 improves the overall strength of the abrasive fluid jet nozzle 40, as gaps or discontinuities that may otherwise cause localized weaknesses in an abrasive fluid jet nozzle and subject such a nozzle to premature wear or failure. Further, each of the two structures, i.e., tubular diamond body 54 and protective casing 56, can be composed of exactly one integral element, that is, each of the tubular diamond body 54 and the protective casing 56 can be made of a single piece or mass of material along its length and throughout its cross-section, without mechanical or other fasteners coupling multiple parts together, which can also improve the overall strength and lifetime of the abrasive fluid jet nozzle 40 by avoiding the presence of localized weaknesses at the thresholds or joints between otherwise multi-element components. Again, although the example embodiment of the nozzle 40 shown in FIGS. 3 through 4 illustrate a bilayer structure (i.e., an inner layer defined by the tubular diamond body 54 and an outer layer defined by the protective casing 56), it is appreciated that the nozzle 40 may comprise a trilayer or other multilayer structure and include a protective casing 56 that includes two or more distinct casing layers, as shown, for example, in the example embodiments of FIGS. 8 through 11, and as described in more detail further below.

According to some embodiments, the abrasive fluid jet nozzles 40 described herein can comprise relatively slender, tubular shapes. For example, such abrasive fluid jet nozzles 40 can have an overall length OL of, or about, or greater than or less than, 25 mm, 38 mm, 50 mm, 75 mm, 100 mm, 113 mm, or 150 mm. As another example, such abrasive fluid jet nozzles 40 can have a cylindrical jet passage 52 with an inner diameter D (which can be measured as maximum inner diameters of a cross-section of the nozzles 40, or as an average inner diameter across a length of the nozzles 40) of, or about, or greater than or less than, 0.5 mm, 0.75 mm, or 1.00 mm. Such abrasive fluid jet nozzles can have a tubular diamond body thickness $T_d$ (which can be measured as average or maximum thickness along the length of the nozzles 40) of, or about, or less than, 0.025 mm, 0.050 mm, 0.100 mm, or 0.150 mm, but greater than 0.01 mm or 0.015 mm. The protective coating thickness $T_p$ (which can be measured as average or maximum thickness along the length of the nozzles) can be of, or about, or greater than, 0.150 mm, 0.500 mm, 1.000 mm, or 2.000 mm. The protective coating thickness $T_p$ may also be the same as, or about, or greater than the tubular diamond body thickness $T_d$, or twice, four times, or ten times the tubular diamond body thickness $T_d$. The abrasive fluid jet nozzles 40 can also have an overall length OL to inner diameter ID ratio of, or about, or greater than 20, 50, 100, 150, 200, or of between 20 and 200 or between 50 and 200.

In one specific example, in such abrasive fluid jet nozzles 40, a cross-section of the jet passage 52 is circular, an inner diameter of the jet passage 52 is less than or equal to 1.5 mm, a tubular diamond body thickness $T_d$ is at least 25 microns, and the protective casing is cylindrical and has a casing thickness $T_p$ at least as thick as the diamond body thickness $T_d$.

The embodiments disclosed above may be particularly suitable for abrasive waterjet cutting applications. In other instances, embodiments may be tailored for use in connection with abrasive suspension jet systems.

For example, according to some embodiments, abrasive suspension jet nozzles may have overall lengths OL that are generally shorter than the corresponding lengths of abrasive waterjet nozzles. Such suspension jet nozzles may have overall lengths OL of, or about, or greater than or less than, 4 mm, 5 mm, 6 mm, 8 mm, 10 mm, or 13 mm. As another example, according to some embodiments, abrasive suspension jet nozzles may have inner diameters ID (which can be measured as maximum inner diameters of a cross-section of the nozzles, or as an average inner diameter across a length of the nozzles) that are generally smaller than the corresponding inner diameters of abrasive waterjet nozzles. Such suspension jet nozzles may have inner diameters ID of, or about, or greater than or less than, 0.15 mm, 0.2 mm, or 0.25 mm.

As another example, according to some embodiments, abrasive suspension jet nozzles may have tubular diamond body thicknesses $T_d$ (which can be measured as average or maximum thicknesses along the length of the nozzles) of, or about, or less than, 0.025 mm, 0.050 mm, 0.100 mm, or 0.150 mm, but greater than 0.01 mm or 0.015 mm. As another example, according to some embodiments, abrasive suspension jet nozzles may have protective coating thicknesses $T_p$ (which can be measured as average or maximum thicknesses along the length of the nozzles) of, or about, or greater than, 0.150 mm, 0.500 mm, 1.000 mm, or 2.000 mm. As another example, according to some embodiments, abrasive suspension jet nozzles may have tubular diamond body thicknesses $T_d$ twice, four times, or ten times the tubular diamond body thicknesses $T_d$. As another example, according to some embodiments, abrasive suspension jet nozzles may have length to inner diameter ratios of, or about, or greater than or less than, 20, 25, or 50.

Other specific combinations of approximate dimensions and characteristics of example nozzles 40 are summarized in the following table:

| Jet Type | Diamond Body Thickness (microns) | Inner Diameter ID (mm) | Length/Inner Diameter Ratio | Length (mm) |
|---|---|---|---|---|
| Abrasive Suspension Jet | 50 | 0.15 | 25 | 4 |
| Abrasive Suspension Jet | 50 | 0.15 | 50 | 8 |
| Abrasive Suspension Jet | 50 | 0.20 | 25 | 5 |
| Abrasive Suspension Jet | 50 | 0.20 | 50 | 10 |
| Abrasive Suspension Jet | 50 | 0.25 | 25 | 6 |
| Abrasive Suspension Jet | 50 | 0.25 | 50 | 13 |
| Abrasive Suspension Jet | 100 | 0.15 | 25 | 4 |
| Abrasive Suspension Jet | 100 | 0.15 | 50 | 8 |
| Abrasive Suspension Jet | 100 | 0.20 | 25 | 5 |
| Abrasive Suspension Jet | 100 | 0.20 | 50 | 10 |
| Abrasive Suspension Jet | 100 | 0.25 | 25 | 6 |
| Abrasive Suspension Jet | 100 | 0.25 | 50 | 13 |
| Abrasive Waterjet | 50 | 0.50 | 50 | 25 |
| Abrasive Waterjet | 50 | 0.50 | 100 | 50 |
| Abrasive Waterjet | 50 | 0.50 | 150 | 75 |
| Abrasive Waterjet | 50 | 0.75 | 50 | 38 |
| Abrasive Waterjet | 50 | 0.75 | 100 | 75 |
| Abrasive Waterjet | 50 | 0.75 | 150 | 113 |
| Abrasive Waterjet | 50 | 1.00 | 50 | 50 |
| Abrasive Waterjet | 50 | 1.00 | 100 | 100 |
| Abrasive Waterjet | 50 | 1.00 | 150 | 150 |
| Abrasive Waterjet | 100 | 0.50 | 50 | 25 |
| Abrasive Waterjet | 100 | 0.50 | 100 | 50 |
| Abrasive Waterjet | 100 | 0.50 | 150 | 75 |
| Abrasive Waterjet | 100 | 0.75 | 50 | 38 |
| Abrasive Waterjet | 100 | 0.75 | 100 | 75 |
| Abrasive Waterjet | 100 | 0.75 | 150 | 113 |
| Abrasive Waterjet | 100 | 1.00 | 50 | 50 |
| Abrasive Waterjet | 100 | 1.00 | 100 | 100 |
| Abrasive Waterjet | 100 | 1.00 | 150 | 150 |

Figure 6A:
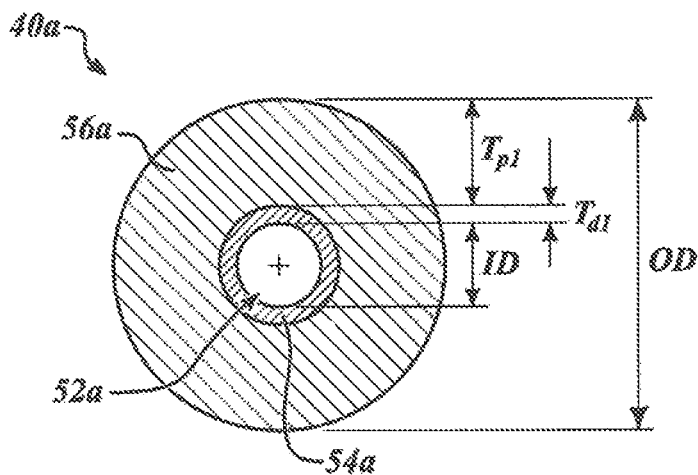
FIGS. 6A through 6C show cross-sections of nozzles having the same outer diameter and having an internal fluid jet passage with the same diameter but having different material layer thicknesses to provide nozzles of different durability, which may be used interchangeably in the same cutting head.
Figure 6B:
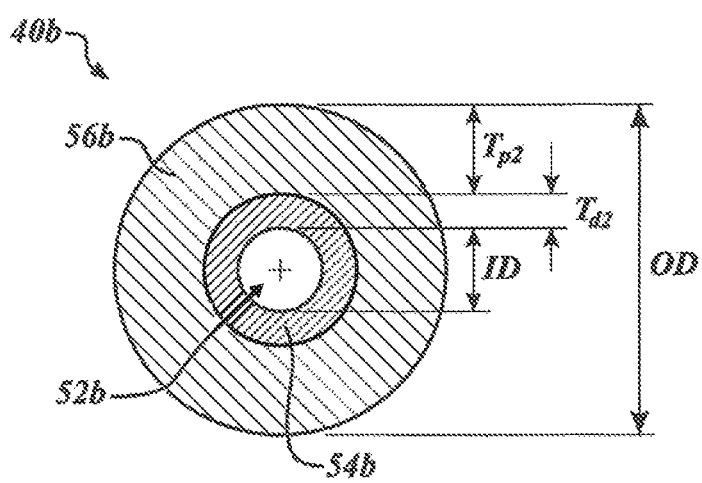
Figure 6C:
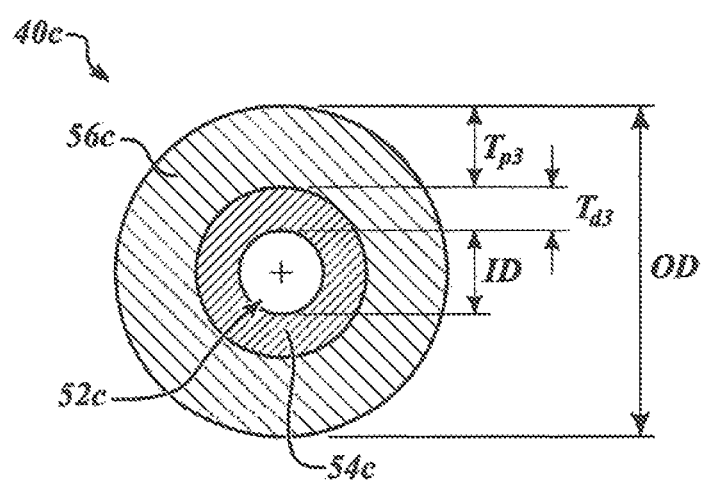

As can be appreciated from the discussion above, nozzles having different durability can be fabricated, with such durability relating at least in part to a thickness of the inner tubular diamond body of such nozzles and to characteristics of the protective casing formed therearound. For example, FIGS. 6A through 6C show cross-sections of nozzles 40a, 40b, 40c having the same outer diameter OD and having an internal fluid jet passage 52a, 52b, 52c with the same diameter ID but having different material layer thicknesses (i.e., the tubular diamond body 54a, 54b, 54c has an inner layer thicknesses $T_{d1}$, $T_{d2}$, $T_{d3}$, respectively, and the protective casing 56a, 56b, 56c, has a thicknesses $T_{p1}$, $T_{p2}$, $T_{p3}$, respectively.) to provide nozzles 40a, 40b, 40c of different durability, which may be used interchangeably in the same cutting head. In this manner, a user may select from one of a collection of nozzles 40a, 40b, 40c that is best suited or "tuned" to the particular cutting operations to which the nozzles 40a, 40b, 40c will be put to use.

Figure 7:
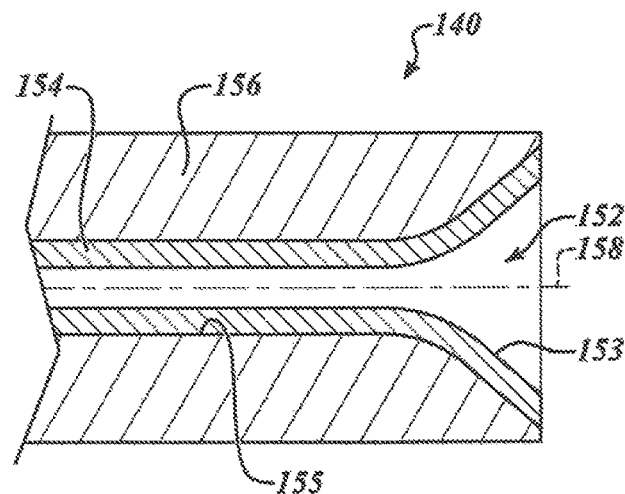
FIG. 7 is a cross-sectional view of an upstream portion of another example abrasive fluid jet nozzle for fluid jet cutting applications.

As previously discussed with reference to the example nozzle 40 of FIGS. 3 through 4, the size and/or shape of the jet passage 52 through the nozzle 52 may vary over the length OL thereof. As one example of this, FIG. 7 illustrates a cross-sectional view of another example embodiment of a reinforced diamond fluid jet nozzle 140, taken parallel to a central longitudinal axis 158 of the fluid jet nozzle 140. As illustrated in FIG. 7, the nozzle 140 includes an inner jet passage 152 that is surrounded by an inner tubular diamond body 154 and is defined by an inner surface thereof 153. The inner tubular diamond body 154 is in turn surrounded by an outer protective casing 156 at interface 155. FIG. 7 shows that the nozzle 140 may have a variable diameter across at least a portion (e.g., an inlet portion) of its length along its central longitudinal axis 158, such that a size and/or a shape of the jet passage 152 varies along at least a portion of the length of the nozzle 140. In particular, the nozzle 140 has a diameter that varies gradually within an inlet portion, such that the jet passage 152 of the nozzle 140 has a flared shape at an upstream end thereof to receive a high-pressure fluid jet during operation. Again, any of the fluid jet nozzles described herein can have a jet passage extending therethrough which varies in size and/or shape along at least a portion of its length to form a jet passage with any suitable cross-sectional profile. For example, the jet passage may have a cross-sectional profile that is circular, oval, hexagonal, or other regular or irregular shape, and the size of the jet passage may expand or contract at one or more locations along the length of the jet passage.

Figure 8:
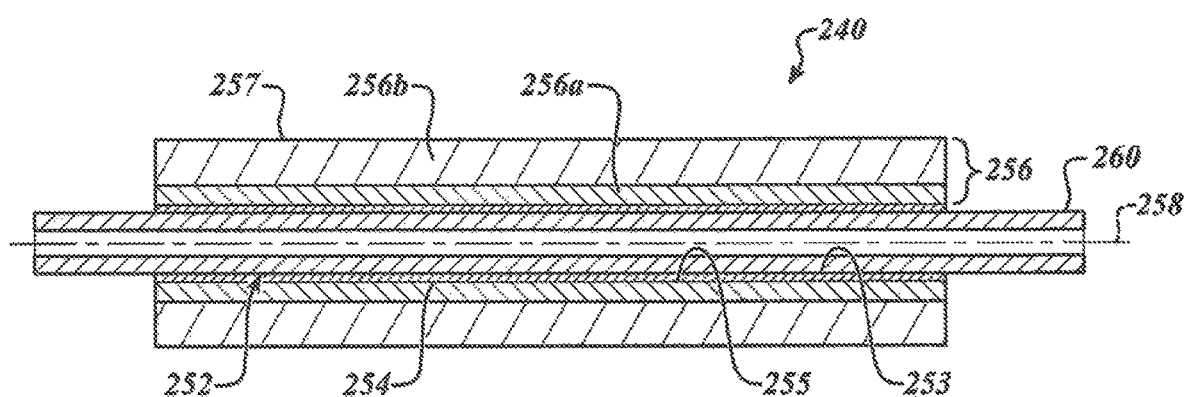
FIG. 8 is a cross-sectional view of yet another example abrasive fluid jet nozzle for fluid jet cutting applications, shown with a hollow mandrel extending therethrough.

As a specific, non-limiting example, FIG. 8 shows a cross-sectional view of another example reinforced diamond fluid jet nozzle 240, taken perpendicular to a central longitudinal axis 258 of the fluid jet nozzle 240. As shown in FIG. 8, the nozzle 240 includes an inner jet passage 252 surrounded by an inner tubular diamond body 254 and defined by an inner surface thereof 153. The inner tubular diamond body 254 in turn is surrounded by an outer protective casing 256 at interface 255. According to the example embodiment of FIG. 8, the outer protective casing 256 may be provided or formed as a multilayer structure (e.g., bilayer structure, trilayer structure). For example, the protective casing 256 may be provided or formed as a bilayer structure having an inner layer 256a radially adjacent to the tubular diamond body 254 and an outer layer 256b radially adjacent to the inner layer 254a. In some instances, the multilayer protective casing 256 may have material properties that vary radially to provide a radial gradient of material properties. For example, a material hardness of the multilayer protective casing 256 may vary radially with a material hardness of the innermost layer (e.g., inner layer 256a) of the multilayer protective casing 256 being greater than a material hardness of the outermost layer (e.g., outer layer 256b). For instance, in some embodiments, the inner layer 256a may comprise or consist of molybdenum or an alloy thereof and the outer layer 256b may comprise or consist of steel. In other embodiments, the inner layer 256a may comprise or consist of steel and the outer layer 256b may comprise or consist of aluminum or titanium, or alloys thereof.

As shown in FIG. 8, the tubular diamond body 254 and the protective casing 256 may be fabricated or built-up on a mandrel, such as, an elongate hollow mandrel 260. The mandrel 260 may comprise or consist of tungsten, molybdenum, tungsten carbide, silicon carbide or other suitable materials. The mandrel 260 may comprise or consist of a refractory metal. In some instances, the mandrel 260 may include opposing ends that extend beyond the ends of the nozzle 240 (or components thereof) to assist in manipulating components of the nozzle 240 during fabrication. The opposing ends of the mandrel 260 may be used, for example, to secure the nozzle 240 (or nozzle components) in a fixture so that an outer surface 257 of the protective casing 256 can be machined to a desired finish with the nozzle 240 securely fixed in position. In such instances, the mandrel 260 may remain within the tubular diamond body 254 while the protective casing 256 is formed around the tubular diamond body 254. In other instances, the mandrel 260 may be removed from the tubular diamond body 254 before the protective casing 256 is formed. The mandrel 260 may be removed (whether before or after forming the protective casing) by a variety of techniques, including, for example, by chemical etching or electrical discharge machining. Such chemical etching or electrical discharge machining may be performed from within an interior cavity of the hollow mandrel 260.

Figure 9:
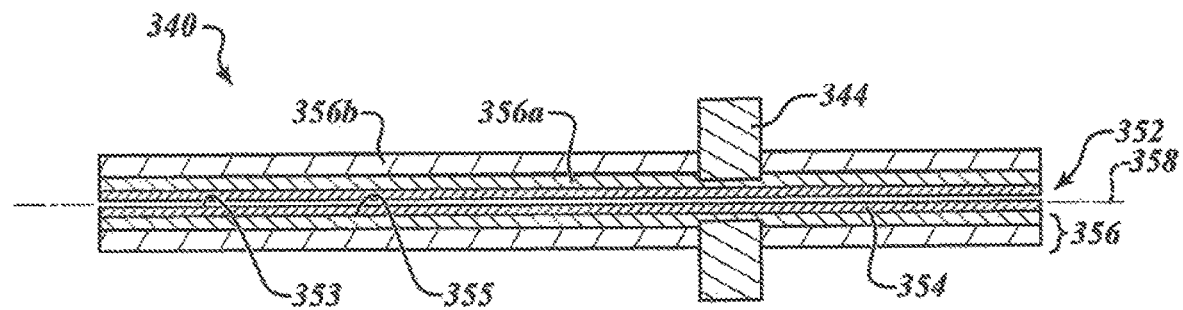
FIG. 9 is a cross-sectional view of yet another example abrasive fluid jet nozzle for fluid jet cutting applications, shown with an annular structure extending radially therefrom.

As a specific, non-limiting example, FIG. 9 shows a cross-sectional view of another example reinforced diamond fluid jet nozzle 340, taken perpendicular to a central longitudinal axis 358 of the fluid jet nozzle 340. As shown in FIG. 9, the nozzle 340 includes a jet passage 352 surrounded by an inner tubular diamond body 354 and defined by an inner surface 353 thereof. The inner tubular diamond body 354 in turn is surrounded by an outer protective casing 356 at interface 355. According to the example embodiment of FIG. 9, the outer protective casing 356 may be provided or formed as a multilayer structure (e.g., bilayer structure, trilayer structure). For example, the protective casing 356 may be provided or formed as a bilayer structure having an inner layer 356a radially adjacent to the tubular diamond body 354 and an outer layer 356b radially adjacent to the inner layer 354a. The inner layer 356a may be made of a material that is different than a material of the outer layer 356b, and material properties (e.g. material hardness) of the layers may vary radially over a thickness of the protective casing 356.

With continued reference to FIG. 9, the nozzle 340 may further include an annular structure 344 (e.g., an annular ring or collar) that extends radially outward from the reinforced diamond nozzle 340 at an intermediate location between opposing ends of the nozzle 340. In some instances, the annular structure 344 may be formed as an integral portion of the protective casing 356 as the protective casing 356 is built-up or otherwise formed around the tubular diamond body 354. In other instances, the annular structure 344 may be distinct from the protective casing 356 and may be coupled to the protective casing, such as, for example, by being partially embedded in the protective casing 356. As an example, the annular structure 344 may be positioned over the tubular diamond body 354 after the protective casing 356 is partially established, and then locked in position by completing the protective casing 356 to abut opposing sides of the annular structure 344. The annular structure 344 may project radially outward from the nozzle 340 to provide a suitable feature for securing the nozzle 340 to a nozzle body (e.g., nozzle body 41 of FIG. 3) for fluid jet cutting operations. In some instances, the annular structure 344 may comprise a collar or ring that encircles a portion of the tubular diamond body 354. The collar or ring may be made of steel and may be magnetic or have magnetic properties. In some instances, the collar or ring may have a circular outer profile with an outer diameter that is about twice the size of the outer diameter of adjacent portions of the nozzle 340, or greater.

Figure 10:
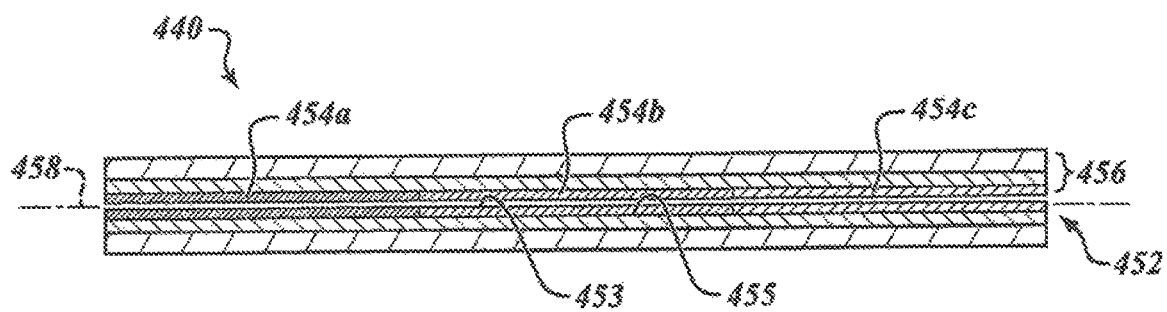
FIG. 10 is a cross-sectional view of yet another example abrasive fluid jet nozzle for fluid jet cutting applications, shown with tubular diamond body units positioned end-to-end therein.

As a specific, non-limiting example, FIG. 10 shows a cross-sectional view of another example reinforced diamond fluid jet nozzle 440, taken perpendicular to a central longitudinal axis 458 of the fluid jet nozzle 440. As shown in FIG. 10, the nozzle 440 includes an inner jet passage 452 surrounded by an inner tubular diamond body comprising a plurality of tubular diamond body units 454a, 454b, 454c and being defined by inner surfaces 453 thereof. The inner tubular diamond body in turn is surrounded by an outer protective casing 456 at interface 455. According to the example embodiment of FIG. 10, the outer protective casing 456 may be provided or formed as a multilayer structure (e.g., bilayer structure, trilayer structure), and material properties (e.g. material hardness) of the layers may vary radially over a thickness of the protective casing 456.

As shown in the example embodiment of FIG. 10, the tubular diamond body may be provided by an arrangement of tubular diamond body units 454a, 454b, 454c that are positioned end-to-end to form an elongate tubular body that extends the length of the resulting nozzle 440. The elongate tubular body may then be coated or otherwise surrounded with the protective casing 456 to reinforce all of the tubular diamond body units 454a, 454b, 454c with the protective casing 456 extending past each mating interface between the tubular diamond body units 454a, 454b, 454c. There may be two or more tubular diamond body units 454a, 454b, 454c arranged end-to-end. The tubular diamond body units 454a, 454b, 454c may be equal or approximately equal in length. The tubular diamond body units 454a, 454b, 454c may be arranged end-to-end to provide a nozzle 440 with a particularly high aspect ratio. Although the tubular diamond body units 454a, 454b, 454c are illustrated as having the same thickness, the thickness of each tubular diamond body unit 454a, 454b, 454c may be different from each other and may vary over a length of the nozzle 440.

Still further, although the tubular diamond body may be provided by an arrangement of tubular diamond body units 454a, 454b, 454c arranged end-to-end, in some embodiments, one or more non-diamond tubular body units (e.g., a tubular body unit made of tungsten carbide or other suitable non-diamond material) may be positioned end-to-end with one or more tubular diamond body units 454a, 454b, 454c to extend the length of the nozzle. In this manner, a material composition of the inner tubular body of the nozzle may vary over a length the nozzle. For example, according to one example embodiment, a nozzle may include at least two inner tubular body units arranged end-to-end with an upstream one of the tubular body units comprising a material that is different than a downstream one of the tubular body units. In one specific embodiment, an upstream tubular body unit may be made of a tungsten carbide composite and a downstream tubular body unit may be made of diamond.

Figure 11:
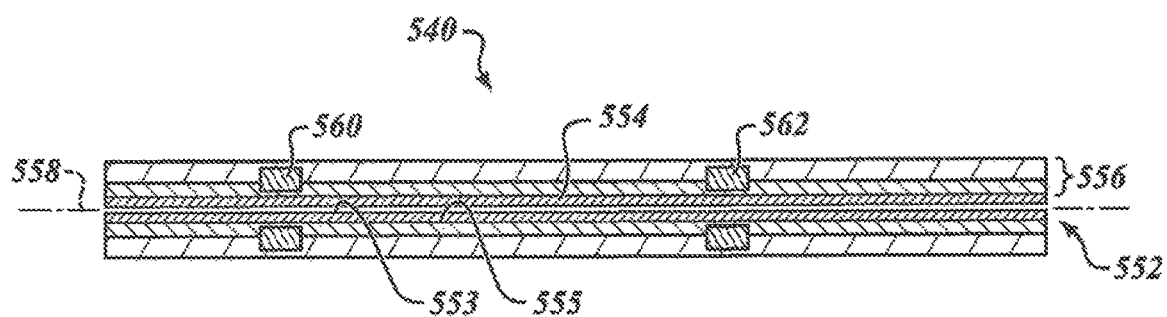
FIG. 11 is a cross-sectional view of still yet another example abrasive fluid jet nozzle for fluid jet cutting applications, shown with sensor components embedded in a protective casing thereof.

As a specific, non-limiting example, FIG. 11 shows a cross-sectional view of yet another example reinforced diamond fluid jet nozzle 540, taken perpendicular to a central longitudinal axis 558 of the fluid jet nozzle 540. As shown in FIG. 11, the nozzle 540 is includes an inner jet passage 452 surrounded by an inner tubular diamond body 554 and defined by an inner surface 553 thereof. The inner tubular diamond body 554 in turn is surrounded by an outer protective casing 556 at interface 555. According to the example embodiment of FIG. 11, the outer protective casing

556 may be provided or formed as a multilayer structure (e.g., bilayer structure, trilayer structure), and material properties (e.g. material hardness) of the layers may vary radially over a thickness of the protective casing 556.

As shown in the example embodiment of FIG. 11, the nozzle 540 may include one or more sensor components 560, 562 embedded, or at least partially embedded, in the protective casing 556. The sensor components 560, 562 may comprise, for example, a magnet or a material having magnetic properties. The sensor components 560, 562 may be positioned to interact with external sensor components, which may be located, for example, within a nozzle body (e.g. nozzle body 41 of FIG. 3) to provide a signal or other indication when the nozzle 540 is properly received or seated within such a nozzle body.

Although various embodiments of the nozzles shown and described herein are directed to reinforced diamond nozzles having a particularly high aspect ratio with a protective casing that surrounds and circumferentially encases an elongate tubular diamond body along an entirety of its length, it is appreciated that, in some instances, a nozzle with lower aspect ratios may be provided. For example, a ratio of the overall length of the nozzle to the diameter of the jet passage may be less than twenty in some instances.

Furthermore, aspects and features of the various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary, to employ features, aspects and/or concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. A method of making a reinforced diamond nozzle for a fluid jet cutting machine, the method comprising:
   identifying an operational lifetime of an orifice assembly to be mounted within the fluid jet cutting machine to generate a fluid jet, the operational lifetime of the orifice assembly based on operational parameters of the fluid jet cutting machine;
   forming or providing a tubular diamond body having an overall length and a jet passage extending therethrough along the overall length, wherein the tubular diamond body is formed or provided having a first thickness that is based on operating parameters and economics of a cutting operation of the fluid jet cutting machine to result in an operational lifetime of the tubular diamond body that matches the identified operational lifetime of the orifice assembly; and
   after forming or providing the first tubular diamond body, establishing a casing made from titanium around the tubular diamond body so that the outer surface of the tubular diamond body is directly contacted by and reinforced by an inner surface of the casing, the casing having a second thickness, and a ratio of the second thickness to the first thickness is greater than or equal to 2:1 and less than or equal to 9:1.

2. The method of claim 1, wherein the operational lifetime of the tubular diamond body includes a number of operational hours multiplied by a factor of safety.

* * * * *